(12) United States Patent
Babu et al.

(10) Patent No.: US 9,097,994 B2
(45) Date of Patent: Aug. 4, 2015

(54) ABRASIVE-FREE PLANARIZATION FOR EUV MASK SUBSTRATES

(71) Applicants: Suryadevara V. Babu, Potsdam, NY (US); Hariprasad Amanapu, Heverlee (BE); Uma Rames Krishna Laguda, Potsdam, NY (US); Ranganath Teki, Valatie, NY (US)

(72) Inventors: Suryadevara V. Babu, Potsdam, NY (US); Hariprasad Amanapu, Heverlee (BE); Uma Rames Krishna Laguda, Potsdam, NY (US); Ranganath Teki, Valatie, NY (US)

(73) Assignees: Sematech, Inc., Albany, NY (US); Clarkson University, Potsdam, NY (US)

( * ) Notice: Subject to any disclaimer, the term of this patent is extended or adjusted under 35 U.S.C. 154(b) by 0 days.

(21) Appl. No.: 13/750,145

(22) Filed: Jan. 25, 2013

(65) Prior Publication Data
US 2013/0209924 A1    Aug. 15, 2013

Related U.S. Application Data

(60) Provisional application No. 61/591,519, filed on Jan. 27, 2012, provisional application No. 61/694,303, filed on Aug. 29, 2012.

(51) Int. Cl.
*H01L 21/461* (2006.01)
*C03C 15/02* (2006.01)
*G03F 1/72* (2012.01)
*G03F 1/24* (2012.01)
*B24B 1/00* (2006.01)
*H01L 21/321* (2006.01)

(52) U.S. Cl.
CPC ... *G03F 1/72* (2013.01); *B24B 1/00* (2013.01); *G03F 1/24* (2013.01); *H01L 21/3212* (2013.01)

(58) Field of Classification Search
USPC .................. 438/692, 693; 216/88, 89; 451/41
See application file for complete search history.

(56) References Cited

U.S. PATENT DOCUMENTS

| 4,676,868 | A | * | 6/1987 | Riley et al. ............... 438/697 |
| 7,250,114 | B2 | * | 7/2007 | Kiehlbauch et al. ........... 216/31 |
| 2004/0077295 | A1 | * | 4/2004 | Hellring et al. ................. 451/41 |
| 2005/0090109 | A1 | * | 4/2005 | Carter et al. ................. 438/692 |
| 2006/0024914 | A1 | * | 2/2006 | Fucsko et al. ................ 438/424 |
| 2007/0007246 | A1 | * | 1/2007 | Idani ............................ 216/88 |
| 2007/0066066 | A1 | * | 3/2007 | Kojima et al. ............... 438/691 |
| 2008/0026525 | A1 | * | 1/2008 | Lu et al. ...................... 438/238 |
| 2008/0311487 | A1 | | 12/2008 | Ito et al. |
| 2011/0171415 | A1 | * | 7/2011 | Eda et al. .................... 428/64.2 |
| 2011/0207327 | A1 | * | 8/2011 | Suzuki et al. ............... 438/693 |
| 2011/0244684 | A1 | * | 10/2011 | Kamimura .................. 438/692 |
| 2012/0149177 | A1 | * | 6/2012 | Nakayoshi et al. .......... 438/478 |
| 2012/0190200 | A1 | * | 7/2012 | Penta et al. .................. 438/692 |

* cited by examiner

*Primary Examiner* — Shamim Ahmed

(74) *Attorney, Agent, or Firm* — Heslin, Rothenberg, Farley & Mesiti, P.C.

(57) ABSTRACT

A process for abrasive-free chemical mechanical planarization of silicon thin film coated EUV mask substrates is disclosed. The process removes bumps and pits on the substrate thereby mitigating reflective errors in the mask. The process employs a two-step polishing procedure, in which the second step is abrasive-free and uses an amine or amine salt as the polishing agent.

12 Claims, 1 Drawing Sheet

US 9,097,994 B2

ABRASIVE-FREE PLANARIZATION FOR EUV MASK SUBSTRATES

CROSS REFERENCE TO RELATED APPLICATIONS

This application claims benefit from U.S. Provisional Applications 61/591,519, filed Jan. 27, 2012, and 61/694,303, filed Aug. 29, 2012. The entire contents of each of the prior applications are incorporated herein by reference.

TECHNICAL FIELD

The invention relates to methods for making Extreme Ultra Violet (EUV) masks and the masks made thereby. Specifically, the invention relates to a method of abrasive-free chemical mechanical planarization (CMP) for ultra-smooth polishing of bumps/pits on silicon thin film coated EUV mask substrates.

BACKGROUND OF THE INVENTION

EUV lithography is a next-generation lithography technology that uses an exposure wavelength of 13.5 nm. The exposure principle of EUV lithography is analogous to that of conventional lithography in that a mask pattern is transferred with an optical projection system. However, a refractive optical system cannot be used because there is no material which is light-transmitting in the EUV light energy region. Therefore, a reflective optical system must be used, and all the optical elements including the photomask need to be reflective. To enable reflection at 13.5 nm, a series of alternative Mo/Si bilayers are deposited on square mask substrates which are commonly 6.35 mm thick. The substrates need to have an ultra-low thermal expansion coefficient, and they require sub-Angstrom surface roughness, sub-50 nm P-V flatness, and as close as possible to zero defects that are larger than 1 nm in height/depth. Current techniques for CMP using abrasive particles produce mask substrates with too many random sub-10 nm pit-type defects and scratches. Moreover, cleaning the substrates after CMP to remove abrasive particles adds to the pit count and enlarges the scratches.

SUMMARY OF THE INVENTION

A solution has now been found to the problem of bumps and pits on the surface of EUV mask substrates.

In one aspect the invention relates to a planarizing method comprising:
 a) depositing upon a substrate that includes a defect a silicon material layer; and
 b) planarizing the silicon material layer, first with an abrasive planarizing fluid and then with an abrasive-free planarizing fluid.

In another aspect, the invention relates to a substrate for a reflective mask for EUV lithography comprising:
 a) a first layer chosen from quartz, glass, TiO$_2$-doped glass and lithium aluminum silicon oxide glass ceramic; and
 b) a second layer chosen from amorphous silicon and polycrystalline silicon. The second layer is from 10 to 250 nm thick and has a surface roughness (RMS) between 0.1 nm and 1.0 nm.

In another aspect, the invention relates to a reflective mask for EUV lithography comprising
 a) a first layer chosen from quartz, glass, TiO$_2$-doped glass and lithium aluminum silicon oxide glass ceramic;
 b) a second layer chosen from amorphous silicon and polycrystalline silicon, said second layer being from 10 to 250 nm thick and having a surface roughness (RMS) between 0.1 nm and 1.0 nm; and
 c) a plurality of alternating layers of molybdenum and silicon.

BRIEF DESCRIPTION OF THE DRAWINGS

These and other aspects, features, and advantages of the present invention will become apparent upon further consideration of the following detailed description of the invention when read in conjunction with the drawing figures, in which.

DETAILED DESCRIPTION OF THE INVENTION

Figure 1:
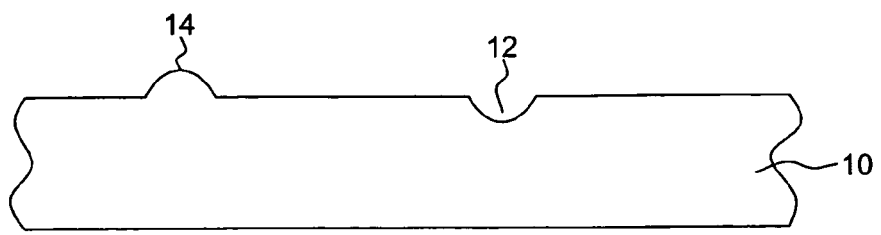
FIG. 1 is a stylized cross-sectional representation of an EUV mask substrate showing, on its surface, a pit and a bump.

In a process aspect, the invention relates to a process for planarizing an EUV mask substrate by depositing on its surface a silicon material and then planarizing the silicon material layer, first with an abrasive and then with an abrasive-free planarizing fluid.

The substrate is a material having a low coefficient of thermal expansion and reduced variation of the coefficient with temperature. Preferably the substrate has a coefficient of thermal expansion at 5° C. to 35° C. between zero and $1\times10^{-7}$ per degree K. Examples of such substrates include quartz, glass, TiO$_2$-doped glass and lithium aluminum silicon oxide glass ceramic. As the low-expansion glass and the extremely-low-expansion glass, a glass comprising SiO$_2$ as the main component can be used. Examples of substrates (sometimes also referred to as "blanks") include ULE (registered trademark; Corning code 7972), ZERODUR (registered trademark of Schott AG, Germany) and materials such as those described by Asahi Glass Company in their U.S. Pat. No. 8,012,653.

The silicon material layer may be chosen from amorphous silicon and polycrystalline silicon, and may be deposited to a thickness between 10 nm and 250 nm, optimally between 50 nm and 150 nm. The silicon may be deposited by ion beam deposition, sputtering, PECVD, VHF glow discharge deposition, indirect microwave deposition, or any other technique known in the art for depositing thin layers of amorphous or polycrystalline silicon on substrates.

The a-Si surface routinely contains native oxide, so it is first polished using abrasives to remove the native oxide before doing the non-abrasive CMP. Typical conditions for the native oxide removal are a 5 wt % colloidal silica dispersion at pH 2 and 4.8 kPa pressure for one minute. These conditions are exemplary and may be varied according to the rate and amount of removal that are desired. For example, one could use 2-10 wt % silica, pH 2.5 to 3.5, 2 to 8 kPa and 30 seconds to 3 minutes or other conditions according to abrasive CMP procedures known in the art.

The abrasive-free fluid comprises at least one amine salt. It may be a salt of a polyamine, for example polyethyleneimine (PEI). The fluid may have a pH between 6.0 and 9.0. As will be evident to the person of skill in the art, an amine such as PEI at pH between 6.0 and 9.0 will be stoichiometrically only partially in the salt form at high pH and more substantially in the salt form at low pH. Also useful in the abrasive-free fluid are quaternary ammonium salts, such as poly diallylammonium chloride and cetyl trimethyl ammonium bromide. An "abrasive" is defined in textbooks as "a hard material that is used to machine, grind, or finish a workpiece." Since, in order to be hard, an abrasive must be in the solid state, a solution will be inherently "abrasive free". Additionally, a suspension or emulsion can be abrasive-free as long as it contains no solids.

As noted above, the silicon material layer may be may be deposited to a thickness between 10 nm and 250 nm, optimally between 50 nm and 150 nm. After polishing, the silicon layer may be from 10 to 100 nm thick and preferably will have a surface roughness (RMS) between 0.01 nm and 0.2 nm, commonly between 0.05 and 0.15. Surface roughness is measured by atomic force microscopy (AFM).

Figure 2:
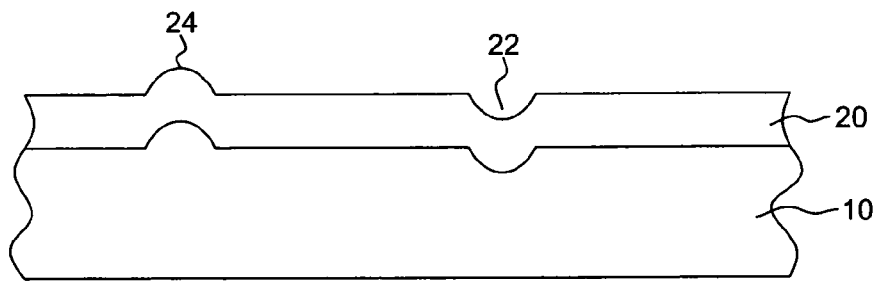
FIG. 2 is a cross-sectional representation of the EUV mask substrate of FIG. 1, showing, on its surface, a layer of amorphous silicon or polycrystalline silicon such that the pit and bump are reflected through the silicon layer.
Figure 3:
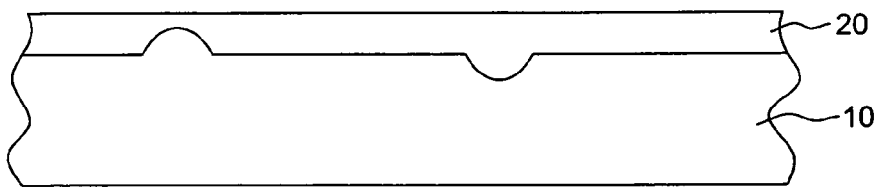
FIG. 3 is a cross-sectional representation of the EUV mask substrate plus a portion of the silicon layer of FIG. 2, showing, on the surface of the silicon layer, the original pit and bump, completely smoothed.

FIG. 1 shows schematically an EUV substrate (10) having pits (12) and bumps (14) on its surface. The height of typical pits and depth of typical bumps (only one of each is shown for simplicity) before the polishing process is approximately 10 nm, although pits as deep as 20 nm and bumps as high as 100 nm can be accommodated. According to an embodiment of the invention shown in FIG. 2, a layer (20) of amorphous silicon is deposited on the substrate (10). The pits and bumps for the most part telegraph through the a-Si layer and show up as defects (22) and (24) on the surface of the silicon layer (20). The silicon layer (20) is then polished down to a fraction of its original thickness, as shown in FIG. 3, and in the process, the defects from the pits (22) and bumps (24) are either completely or significantly reduced in relative depth and height, respectively, such that the defects are below the printability threshold.

In embodiments of the process, the planarization will remove 40, 50, 60 or 70 nm of silicon layer (20), usually about 50 nm. The ideal would be to completely eliminate the existing pit and bump defects and, in the process, not add any new or additional defects on the surface while achieving a surface roughness of <0.1 nm RMS. As a practical matter, even a significant reduction in pit and bump defects, achieving a surface roughness of <0.1 nm RMS without complete elimination of the defects, is advantageous.

A 150 nm thick a-Si thin film was deposited in an ultra-clean ion-beam deposition system at SEMATECH. The surface roughness of the thin film, before polishing, was 0.144. All the polishing experiments were performed on a GnP Poli-500 polisher using platen/carrier speeds of 15/15 rpm and a fluid flow rate of 200 mL/min. The a-Si surface was polished using a 5 wt % colloidal silica dispersion at pH 2 and 4.8 kPa pressure for one minute. Following removal of the native oxide, abrasive-free solutions containing 250 ppm of polyethyleneimine (PEI) with molecular weight 800 (obtained from Sigma Aldrich) were used in these experiments. The pH was adjusted to 8.0 using KOH and $HNO_3$, as necessary. Both an IC 1000 K-groove pad (Rodel) and a POLI-TEX® pad (Dow) were evaluated for the polishing experiments. Removal rates were measured using a Filmetrics F-20 interferometer and the surface roughness was measured using a scanning probe microscopy tool with 1×1 pm sq. scan area. A series of initial experiments to explore the polishing dynamics of amorphous silicon with the abrasive-free fluid were carried out using a thick (1000 nm) film of amorphous silicon on a silicon wafer substrate. Table 1 shows the effects of pressure on removal rate and surface roughness.

TABLE 1

| Experiment # | Pressure (kPa) | Removal rate (nm/min) | RMS roughness (nm) |
|---|---|---|---|
| 1 | 3.5 | <1 | 0.09 |
| 2 | 4.8 | <1 | 0.26 |
| 3 | 6.9 | 32 ± 3 | 0.31 |
| 4 | 6.9 for 1 min then 3.5 for 1 min | 33 ± 3 | 0.11 |

Surface roughness was correlated with pad pressure. Lower pad pressure resulted in greater smoothness (lower roughness), but the removal rate was also low. Greater pad pressure resulted in a more advantageous removal rate accompanied by an increase in roughness. The optimal process conditions were to first polish at higher pressure (e.g. 6-8 kPa) to remove sufficient material thickness and then lower the pressure (e.g. to 2-4 kPa) to lower the surface roughness to below 0.1 nm RMS. The surface roughness results achieved on a-Si coated EUV substrates polished under two different CMP pressure conditions were 0.091 at 2.0 kPa and 0.098 at 3.5 kPa. In both runs the process reduced the surface roughness on a-Si coated substrates from 0.15 to <0.1 nm RMS.

To verify that pit type defects were indeed being removed by the a-Si CMP process, certain defects were identified and marked on a Lasertec M1350 inspection tool and characterized on the atomic force microscope (AFM), post a-Si deposition. Then the substrate was polished and the same defect location was scanned on the AFM to determine if the pit was removed. In one such example, a 3.3 nm deep pit was completely polished away using abrasive-free polishing with polyethyleneimine.

In evaluating a process for planarizing an EUV blank, in addition to the question of whether the process can remove the existing pit/scratch/bump defects, there is a further concern that the process itself create no defects, or, if it does create defects, that it creates fewer defects on the a-Si surface than were originally present. We compared the defectivity of the a-Si CMP process with that of a typical colloidal silica based CMP process on fused silica substrates on the same CMP tool while achieving a similar level of surface roughness. It was found that the relative number of scratches caused by the abrasive-free polishing was about 7 times lower than that using colloidal silica CMP.

Figure 4:
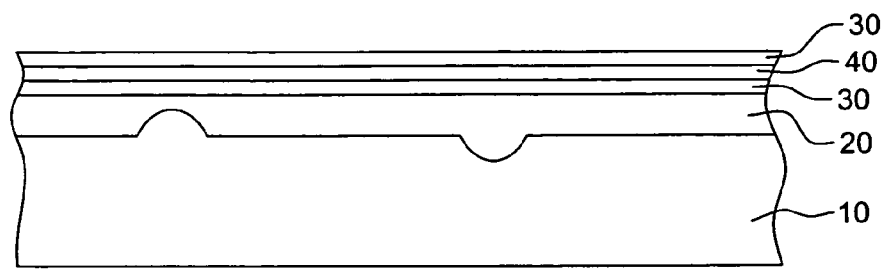
FIG. 4 is a cross-sectional representation of a device containing the EUV mask substrate, the silicon layer and a plurality of alternating layers of silicon and molybdenum.

FIG. 4 is a cross-sectional representation of a device containing the EUV mask substrate (10), the silicon layer (20) and a plurality of alternating layers of molybdenum (30) and silicon (40).

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention should be determined with reference to the appended claims, along with the full scope of equivalents to which such claims are entitled.

What is claimed is:

1. A planarizing method comprising:
   a) depositing a silicon material layer upon a substrate that includes a defect; and
   b) planarizing said silicon material layer, first with an abrasive planarizing fluid and then with an abrasive-free planarizing fluid to provide a silicon material layer from 10 to 100 nm thick over said substrate that includes a defect.

2. A method according to claim 1 wherein said silicon material layer is chosen from the group consisting of amorphous silicon and polycrystalline silicon.

3. A method according to claim 1 wherein said silicon material layer is deposited to a thickness between 50 nm and 150 nm.

4. A method according to claim 1 wherein said substrate is a material having a coefficient of thermal expansion at 5° C. to 35° C. between zero and $1 \times 10^{-7}$ per degree K.

5. A method according to claim 4 wherein said substrate is chosen from the group consisting of quartz, glass, $TiO_2$-doped glass and lithium aluminum silicon oxide glass ceramic.

6. A method according to claim 1 wherein said abrasive-free fluid comprises at least one amine salt.

7. A method according to claim 6 wherein said amine salt is a salt of a polyamine.

8. A method according to claim 7 wherein said polyamine is polyethyleneimine.

9. A method according to claim 6 wherein said amine salt is a quaternary amine salt.

10. A method according to claim 9 wherein said quaternary amine salt is chosen from the group consisting of poly diallylammonium chloride and cetyl trimethyl ammonium bromide.

11. A method according to claim 6 wherein said abrasive-free fluid has a pH between 6.0 and 9.0.

12. A method according to claim 1 wherein said abrasive fluid is a colloidal silica dispersion at pH 2.

* * * * *